US012273118B2

(12) United States Patent
Olson

(10) Patent No.: US 12,273,118 B2
(45) Date of Patent: Apr. 8, 2025

(54) FLEXIBLE ATOMIC CLOCK

(71) Applicant: ColdQuanta, Inc., Boulder, CO (US)

(72) Inventor: Judith Olson, Northglenn, CO (US)

(73) Assignee: ColdQuanta, Inc., Boulder, CO (US)

( * ) Notice: Subject to any disclaimer, the term of this patent is extended or adjusted under 35 U.S.C. 154(b) by 0 days.

(21) Appl. No.: 18/386,232

(22) Filed: Nov. 1, 2023

(65) Prior Publication Data

US 2024/0146319 A1    May 2, 2024

Related U.S. Application Data

(60) Provisional application No. 63/431,283, filed on Dec. 8, 2022, provisional application No. 63/421,881, filed on Nov. 2, 2022.

(51) Int. Cl.
*H03L 7/26* (2006.01)
*G04F 5/14* (2006.01)

(52) U.S. Cl.
CPC .................. *H03L 7/26* (2013.01); *G04F 5/14* (2013.01); *G04F 5/145* (2013.01)

(58) Field of Classification Search
CPC ... H03L 7/26; G04F 5/145; G04F 5/14; H03B 17/00
See application file for complete search history.

(56) References Cited

U.S. PATENT DOCUMENTS

| | | | | |
|---|---|---|---|---|
| 5,606,291 A | * | 2/1997 | Verbanets | H03L 7/26 331/3 |
| 2019/0245315 A1 | * | 8/2019 | Goka | H01S 5/0687 |
| 2023/0185328 A1 | * | 6/2023 | Grop | H03L 7/26 713/500 |

FOREIGN PATENT DOCUMENTS

CN           116819932           9/2023

* cited by examiner

*Primary Examiner* — Ryan Johnson
(74) *Attorney, Agent, or Firm* — Schwegman Lundberg & Woessner, P.A.

(57) ABSTRACT

A method for controlling an atomic clock is described. The method includes receiving, at a processor, a request including an operational mode of multiple operational modes for the atomic clock. The atomic clock includes a local oscillator, a vapor cell, a detector, and a local oscillator controller. The vapor cell includes atoms and receives from the local oscillator a signal having a frequency. The signal causes transitions of the atoms between atomic energy states. The detector detects the transitions and provides to the local oscillator controller an error signal based on the transitions. The error signal indicates a difference between the frequency and a target frequency. The local oscillator controller controls the local oscillator based on the error signal. The processor determines, based on the operational mode, values for control parameters for the atomic clock. The atomic clock is controlled using the values of the parameters.

20 Claims, 3 Drawing Sheets

FLEXIBLE ATOMIC CLOCK

CROSS REFERENCE TO OTHER APPLICATIONS

This application claims priority to U.S. Provisional Patent Application No. 63/421,881 entitled ATOMIC CLOCK WITH SOFTWARE-DEFINED PERFORMANCE filed Nov. 2, 2022 and U.S. Provisional Patent Application No. 63/431,283 entitled ATOMIC CLOCK WITH PROGRAMMABLE PERFORMANCE filed Dec. 8, 2022, both of which are incorporated herein by reference for all purposes.

BACKGROUND OF THE INVENTION

Various technologies, such as Global Positioning Systems (GPS), satellites, power grids, and cellular telephones, rely on highly accurate time measurements. For many such applications, atomic clocks are the desired standard by which time is measured. Atomic clocks provide a stable signal having a highly accurate frequency. The frequency of this signal is controlled based on a standard that is essentially unchanging: the frequency corresponding to energy for particular atomic transitions.

The operation of atomic clocks is specific to the application with which they are used. This process of fabricating clocks for particular applications is typically time-consuming, expensive, and highly tailored to individual applications. For example, some applications require atomic clocks that are very highly accurate. The frequency of the output signal from such an atomic clock is desired to very closely correspond to the definition of a second. For other applications, the atomic clocks are desired to have high precision. For a high precision, the frequency of the output signal from the atomic clock has a high repeatability over time. Matching the frequency to the definition of a second is of less importance. An atomic clock that has high accuracy often has lower precision (i.e. lower repeatability). For example, such a highly accurate atomic clock may utilize a higher intensity laser for interrogating atoms (e.g. neutral atoms, charged atoms (ions), and/or other entities having transitions between energy levels). Short of being far into transition saturation, a higher intensity laser typically results in a higher signal-to-noise ratio (SNR), which may provide higher precision at short timescales (~1 s). However, in such cases the atoms are subject to a larger frequency shift from their natural resonance and thus typically have larger uncertainty in the clock's resonance frequency. This results in a lower accuracy (less certain frequency output) and more drift prone (lower long-term instability) performance. Conversely, a clock interrogated at low laser powers usually experiences a smaller Stark shift, thus is usually more accurate and less susceptible to long-term drifts incited by laser power fluctuations. Each of these clock systems are separately fabricated, which may increase the time taken to provide atomic clocks for various applications. Further, atomic clocks having different timescales, noise, and/or holdover periods may be desired to be used for different purposes in a particular application. Such atomic clocks may have different form factors and environmental sensitivities. This may complicate or prevent their use in the same application.

Consequently, what is desired is an atomic clock that has improved flexibility and that can be used in multiple applications having different requirements, for example with high accuracy, long holdover, and high precision applications.

BRIEF DESCRIPTION OF THE DRAWINGS

Various embodiments of the invention are disclosed in the following detailed description and the accompanying drawings.

DETAILED DESCRIPTION

Figure 1:
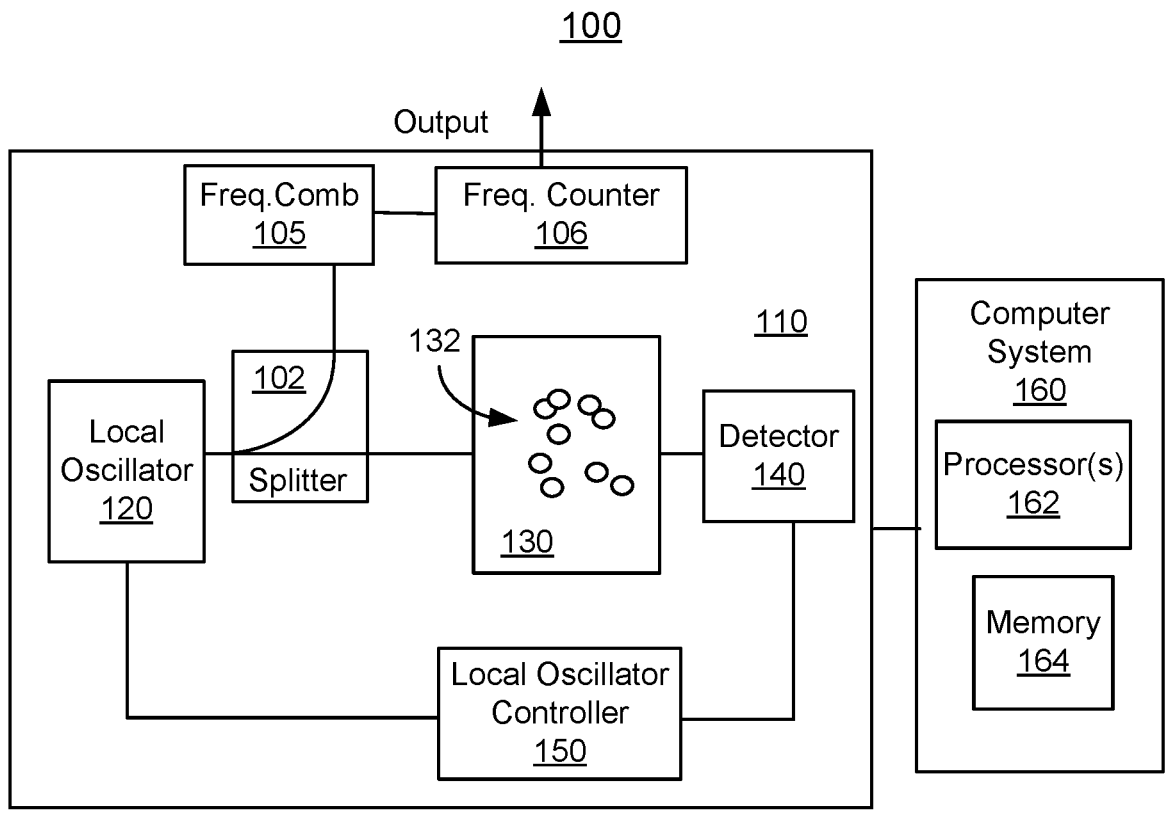
FIG. 1 is a diagram depicting an embodiment of a flexible atomic clock.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A method for controlling an atomic clock is described. A computer program product embodied in a non-transitory computer readable medium and comprising computer instructions that provide the method is also described. The method includes receiving, at a processor, a request including an operational mode for the atomic clock. The operational mode is one of multiple operational modes possible for the atomic clock. The atomic clock includes a local oscillator, a vapor cell or other type of atomic source, a detector, and a local oscillator controller. The vapor cell (or alternative source, like atomic beam or cold atom sources) includes atoms and is configured to receive from the local oscillator a signal having a frequency near a chosen atomic resonance frequency. Exposure to this near or on-resonant light signal results in transitions of the atoms between atomic energy states. The detector is configured to detect the transitions, usually via fluorescence, at DC or RF frequencies, and to provide to the local oscillator controller a frequency correction signal based on the transitions. A non-zero error signal indicates a difference between the frequency and a target frequency. The local oscillator controller is configured to control the local oscillator based on the error signal. The processor determines, based on the operational mode, values for control parameters for the atomic clock. The control parameters include at least one of local oscillator parameters, vapor cell parameters, detector parameters, local oscillator controller parameters, and error signal processing parameters. The method further includes automatically controlling the atomic clock using the values of the control parameters.

The method may further include monitoring characteristics of the local oscillator, the vapor cell, and/or the detector. The processor updates the value(s) of one or more of the control parameters based on the characteristics. In some embodiments, determining the values for the control parameters includes the processor restricting a value to within an operational window for a corresponding control parameter.

In some embodiments, the operational modes include a high precision (low phase noise) mode and a long-term holdover mode. For example, the high precision mode may have a short-term fractional frequency instability of less than $10^{-13}$ before 1 second of averaging time or for operation between one second and multiple days (e.g. 2, 3, 4, 5, 6, 7, or more days). The long-term mode may have a long-term fractional frequency instability reaching less than $10^{-13}$ by hundreds or thousands of seconds and a frequency drift of not more than one part in $10^{12}$ for long-term operation times of at least one day and not more than two weeks. The operational modes may further include a user-defined operational mode.

The local oscillator may be a laser. In some such embodiments, the control parameters include at least one of a vapor cell temperature set point, a vapor pressure set point for the vapor cell, an atomic clock temperature set point, a laser intensity set point for the laser, a detector filtering bandwidth, a polarization purity or angle control of the signal from the laser, a detector gain, and proportional integral differential (PID) coefficients for at least one servo. The servo(s) control at least one of the laser, the vapor cell, the detector, and the local oscillator controller.

An atomic clock is described. The atomic clock includes a local oscillator, a vapor cell, a detector, a local oscillator controller, and a processor. The vapor cell includes a plurality of atoms and receives from the local oscillator a signal having a frequency. The signal results in transitions of the atoms between atomic energy states. The detector detects the transitions. The local oscillator controller is coupled to the detector and the local oscillator. The detector provides to the local oscillator controller an error signal based on the transitions. The error signal indicates a difference between the frequency and a target frequency. The local oscillator controller controls the local oscillator based on the error signal. The processor is configured to receive a request including an operational mode for the atomic clock. The atomic clock has multiple operational modes of which the operational mode in the request is one. The processor is also configured to determine, based on the operational mode, values for control parameters for the atomic clock. The control parameters include at least one of local oscillator parameters, vapor cell parameters, detector parameters, local oscillator controller parameters, and error signal processing parameters including bandwidth, filtering, and PID coefficients. Thus, the processor is also configured to control the atomic clock using the values. For example, the atomic clock may include analogous monitors that are used in a similar manner, analogous operational mode(s), and/or analogous control parameters.

FIG. 1 is a diagram depicting an embodiment of flexible atomic clock 100. Atomic clock 100 includes physics package 110 and computer system 160. Physics package 110 includes local oscillator 120, splitter 102, frequency comb 105, frequency counter 106, vapor chamber 130 having atoms 132 therein, detector 140, and local oscillator controller 150. Atoms 132 may include neutral atoms, charged atoms (i.e. ions), molecules, and/or other particles that may be used in an atomic clock and undergo atomic transitions analogous to the manner described herein. In some embodiments, other and/or additional components may be included. For example, monitor(s) to interrogate the properties of physics package 110 and components therein may be included. Such monitors might include temperature sensors, inertial sensors, current sensors, voltage sensors, pressure sensors, spectral sensors (to determine the spectral content of laser light), and/or other sensors. Similarly, control hardware for components other than local oscillator 120 may be included. For example, heaters (temperature control), coolers such as Peltier coolers (temperature control), liquid crystal variable retarders (polarization control), filters (signal processing control), and/or other components used in controlling atomic clock 100 may be incorporated. Computer system 160 includes processor(s) 162 configured to execute computer instructions that may be stored in memory 164. Computer system 160 may also include other components, such as used in providing input/output.

In some embodiments, atomic clock 100 is a rubidium optical atomic clock 100. In such embodiments, local oscillator 120 may be a diode or other laser that outputs an oscillator signal. In such embodiments, the oscillator signal is an optical signal having a target wavelength, such as 1556.2±2 nm. Fiber splitter 102 splits the oscillator signal. A portion of the optical signal, which is typically a small fraction of local oscillator 120 output, is sent through frequency comb 105 to form a beat note. Frequency comb 105 stabilizes the output of atomic clock 100 for the wavelength of the oscillator signal being within a target range. The output of frequency comb 105 may be provided to frequency counter 106, which detects the frequency and outputs a count. This count is an accurate and precise measure of time. Additional offsets or other output signal conditioning modules may be implemented between the clock/comb beat note or injection lock and the clock output signal. In some embodiments, frequency comb 105 may be directly seeded with the clock laser (from local oscillator 120) instead of requiring a beat note lock or other methods.

The remaining portion of the oscillator signal from local oscillator 120 is provided from splitter 102 to vapor chamber 130. In some embodiments, the oscillator signal is provided to a converter (not shown), which converts the oscillator signal to a probe signal having the desired properties for probing atoms 132. For example, such a converter may modulate the oscillator signal and/or convert the frequency (e.g. doubling the frequency and, therefore, halving the wavelength). Thus, the probe signal from local oscillator 120 is input to vapor cell 132. In some embodiments, the signal modulation or other changes can be directly implemented on the laser driver signals instead of requiring a down-stream modulator.

In response to the input probe signal from local oscillator 120, atoms 132 may be excited. Thus, atoms 132 undergo a transition between atomic energy levels. Atoms 132 in an excited state emit photons (i.e. fluoresce) and return to their ground state. In some embodiments, atoms 132 undergo a two photon transition. In some embodiments, additional lasers (pulsed or CW) or radiation fields may be applied to prepare the atomic clock, such as in ion, lattice, or beam clocks addressing more complicated atomic or molecular structures. Further, local oscillator 120 and vapor cell 130 (including atoms 132) may be configured such that the probe signal is off resonance, such as using sideband or offset locking. Resonance occurs if the frequency of the probe signal matches the frequency of the transitions. For example, for a frequency of the transition corresponding to a 780 nanometer wavelength, an on-resonance probe signal has a frequency corresponding to a 780 nanometer wavelength. In the embodiment shown, the frequency of the probe signal provided to vapor chamber 130 may correspond to a 778 nanometer wavelength. Thus, the frequency of the (off-resonance) probe signal may be up to 10× the natural linewidth away from resonance. In some embodiments, the width of the atomic resonance may be broadened to enable a larger capture window for acceptable clock laser frequencies. Narrower capture windows may be desired instead.

This process of excitation and return to the ground state is detected by detector 140. In some embodiments, the signal, which may be demodulated in processing, from detector 140 is proportional to the difference between the frequency of the signal input to vapor chamber 130 (and thus related to the oscillator signal of local oscillator 120), and the resonance frequency of transitions of atoms 132. The difference between the target frequency of local oscillator 120 and the frequency of the oscillator signal output by local oscillator 120 may be determined based on the signal detected by detector 140. Thus, detector 140 outputs a detection signal 140 that is provided to local oscillator control 150.

Local oscillator controller 150 obtains an error signal that indicates the error between the target frequency and the frequency of the oscillator signal from local oscillator 120. Local oscillator controller 150 also generates a control signal based on the error. The control signal is used to adjust the frequency of the local oscillator 120 to maintain it within the target range. Local oscillator controller 150 may include a proportional integral differential (PID) controller. A PID controller uses a proportional (e.g. multiplied by a coefficient) value of the current signal, an integral of past values of the signal, and a derivative of the current value of the signal to take into account the present, past, and future values of the signal and generate control signals accordingly.

Using physics package 110, atomic clock 100 may provide an accurate and precise measure of time based on a known and unvarying standard: the energy levels of atoms 132 in vapor chamber. However, without computer system 160, atomic clock 100 may be limited to a specific application. For example, physics package 110 may be configured for high short-term precision (e.g. using a higher intensity signal from the laser in local oscillator 120) but be subject to drift because of a drift in intensity of local oscillator 120. This drift may come from inherent laser noise, or changing signal strength reaching the intensity servo detector, or from changes in the laser polarization as it is passing through optics on the way to the atomic chamber. Alternatively, physics package 110 may be configured for lower short-term precision (stability) but subject to lower accuracy (e.g. via larger shift uncertainty for larger laser intensity for local oscillator 120). Physics package 110 may be configured for stationary operation and thus provide poor measurements of time if in motion dues to vibrations and/or shocks to clock 100. However, atomic clock 100 also includes computer system 160.

Computer system 160 is configured for controlling components of atomic clock 100, such as those present in physics package 110. More specifically, computer system 160 in conjunction with physics package 110 allows for atomic clock 100 to operate in a more flexible manner. Off-resonance operation of physics package 110 in combination with additional monitors and controllers that may be updated (e.g. local oscillator controller 150) and computer system 160 allow for atomic clock 100 to operate in different modes. Via computer system 160, a user (e.g. an individual or an application on or communicating with computer 160) may provide a request. The request received by processor(s) 162 includes an operational mode the atomic clock 100. Atomic clock 100 thus has multiple operational modes, one of which is identified by the request. In some embodiments, the operational mode includes a high accuracy, long-term holdover mode and a high precision, drift impacted mode. In some embodiments, other and/or additional modes may be present. For example, an intermediate mode may be selected or identified by the parameter values (and/or range(s) of values) in the request. In some embodiments, a user may select a particular Allan deviation (ADEV) or a holdover decade via the request. The Allan deviation indicates the variance in the frequency stability for a particular sampling period. The holdover decade indicates the timing and frequency accuracy maintained over time between synchronizations of frequency of the output from local oscillator 120 and the atomic transitions of atoms 132. In some embodiments, the particular ADEV, holdover decade, and/or other parameters are selected by the user via computer system 160. In other embodiments, such intermediate operational modes of atomic clock 100 may be made partly or fully via analog components once such a mode is selected via computer system 160. Another mode may be optimized for rugged environmental deployment, thus having broader capture ranges and servo tuning parameters tolerant of larger environmentally-induced perturbations in the clock parameters.

Based on the operational mode in the request, processor 162 determines values for one or more control parameters for atomic clock 100. The control parameters include at least one of local oscillator parameters, vapor cell parameters, detector parameters, or frequency controller parameters. For example, in response to selection of a high stability performance mode, computer system 160 may select a higher intensity for local oscillator 120. For a holdover (long-term) mode, computer system 160 may select a lower intensity for local oscillator 120. Similarly, for a particular operational mode, temperature of vapor cell 130 and/or PID coefficients of controller(s) such as local oscillator controller 150 may be selected based on the operational mode to either improve SNR or reduce thermal shifts. In another example, based on the desired ADEV for a one second observation time the user has provided via the request, processor(s) 162 may look up setpoints that enable tailoring the clock algorithms to optimize long-term performance servo loop settings for local oscillator controller 150 and/or other components of physics package 110. In some embodiments, therefore, selection of the values for control parameters includes utilizing a lookup table to provide the desired values corresponding to the particular operational mode. In other embodiments, a real-time parameter tuning process may be applied by computer system 160 to adjust settings based on the unit's current environment. An example of probable tuning points for different modes of operation is given:

Examples of values for some control parameters for particular modes include the following. Nothing prevents other modes using the same or other control parameters and/or other values for the control parameters indicated. Similarly, in some cases, the same modes may utilize other control parameters and/or other values for the control parameters indicated. For a long-term holdover mode, benign environment mode, values for control parameters include 80° C. vapor cell set point, 5 mW incident laser power set point, narrow windows on capture region, standard servo bandwidths. For a high short-term performance mode, benign environment values for control parameters may include 110° C. vapor cell set point, 45 mW incident laser power set point, narrow windows on capture regions, PID parameters set just below oscillation levels. For a ruggedized transit (shock/vibe) operation mode, values for control parameters may include 110° C., 45 mW incident laser power set point, wide capture range and low PID parameters far from oscillation level, faster servo bandwidth and feedback rates for intensity and temperature servos, higher modulation frequency choice for clock laser, larger modulation depth for extended capture region. For a low power and long lifetime operation mode values for control parameters may include 70° C. vapor cell set point, 2 mW incident laser power set point, slower update rate for vapor cell temp servo and intensity servo, narrow capture region. For a user-defined middle ground mode for data centers, values for control parameters may include 100° C. cell temp, 20 mW incident laser power, medium capture range and PID tuning. For a travel mode for large altitude changes, values for control parameters may include ruggedized mode parameter values plus feed forward for pressure changes. In some embodiments, resilient mode may operate like standard mode, but include comparison against Global Navigation Satellite System (GNSS) signals to flag potential GNSS interference or clock wander. Resilient mode may instead incorporate a miniaturized atomic clock with lower performance inside for backup operation or enhanced monitoring capabilities. Resilient mode may take advantage of an in-chassis frequency comparator module to provide additional information or feedback control loops for users. For a dynamic mode, values for control parameters may include 110° C. vapor temp, 45 mW laser power, high bandwidth servo auto-tuning, large capture region, low sensitivity PID tuning, and real-time feed forwards for environmental changes in temperature, pressure, humidity, magnetic or electrostatic fields, or other parameters. Modes may take on any such form or combination of forms based on the user-driven performance desires and deployment environment.

Computer system 160 automatically controls atomic clock 100 using the values of the control parameters corresponding to the operational mode selected. For example, processor 162 communicates with local oscillator controller 150 to provide the values of control parameters related to intensity. In addition to the set point for the intensity (i.e. the target power provided to local oscillator 120), computer system 160 may provide the appropriate PID coefficients for local oscillator controller 150. Local oscillator controller 150 then controls the intensity of the laser of local oscillator 120 in accordance with values of the control parameters provided by processor(s) 162 and, therefore, the operational mode selected.

In some embodiments, processor(s) 162 also monitor characteristics of atomic clock 100 and update the values of the control parameters based on the characteristics. One or more components of physics package 110, such as local oscillator 120, the vapor cell 130, detector 140, and/or local oscillator control 150 may be monitored. For example, temperature, pressure, current, and voltage of various components may be monitored. In some embodiments, temperature and/or pressure sensors may reside in vapor chamber 130 to monitor the conditions for atoms 132. Temperature sensor(s) may monitor the temperature(s) of physics package generally (e.g. the temperature of the environment in which physics package 110 resides). The intensity, polarization, and/or spectral content of the laser of local oscillator 120 may also be monitored. Processor(s) 162 updates the value(s) one or more of the control parameters based on the characteristics. For example, the set point of the intensity for the laser of local oscillator 120 may be increased or decreased based on changes in the temperature of physics package 110.

Atomic clock 100 is configured such that the values of control parameters determined during initial selection and updating may not compromise performance of atomic clock 100. Control parameters may be restricted to particular operational windows for some or all operational modes. For example, a temperature or a change in the temperature of vapor cell 130 may result in processor(s) 162 calculating a value for the intensity set point that is too high or too low for desired operation of local oscillator 120. In such a case, the value of the intensity set point may be limited to the highest or lowest endpoint of the operational window. Similarly, atomic clock 100 is configured such that physics package 110 remains functional over the desired operational modes. For example, local oscillator 120, atoms 132, and vapor cell 130 are configured to operate off of resonance. As a result, the intensity of local oscillator 120 may be increased without substantial loss of atoms 132 (e.g. due to atoms 132 interacting with the walls of vapor chamber 132). Thus, physics package 110 and the values of control parameters determined by processor(s) 162 are such that atomic clock 100 can operate in the selected operational modes.

Thus, the combination of physics package 110 and computer system 160 may provide atomic clock 100 that has improved flexibility. For example, atomic clock 100 may have a high short-term stability mode that has fractional frequency instability less than $10^{-13}$ for operation times between 1 second and multiple days. Atomic clock 100 may also have a long-term holdover mode that has a short-term instability greater than $10^{-13}$ but long-term fractional frequency instability (>1000 seconds) of less than $10^{-13}$ and a frequency drift of not more than one part in $10^{12}$ for long-term operation times of at least one day and not more than two weeks. Thus, the same atomic clock 100 may provide either a high short-term stability mode or an accuracy/holdover mode. Instead of utilizing multiple different clocks in the applications in which competing performance modes (e.g. long-term and high accuracy) are desired, a single atomic clock 100 may be used, simplifying multi-clock ensemble integration, control, and monitoring systems. A single clock may also be utilized for a range of applications over its lifetime as opposed to being suitable to only a narrow range of clock operational performance. Issues with respect to integrating atomic clocks having different responses to the environment (e.g. temperature)

may be reduced or eliminated. Further, the size and power requirements, production complexity, and time of production may be reduced. Production of the device including atomic clock 100 in lieu of multiple atomic clocks may be simplified. The operational modes may further include a user-defined operational mode, such as a user may specifying an ADEV or holdover. Such modes may be unavailable in conventional atomic clocks. In addition, aging issues which may otherwise limit its lifetime may be accounted for by atomic clock 100.

Atomic clock 100 also allows for improved power management. Power consumption of conventional atomic clocks is typically fixed for a given operational mode. In power outage or shortage conditions, these clocks become entirely unusable. In contrast, servos for atomic clock 100 can be altered to reduce the electrical intervention needed. For example, if performing like a maser (high short-term stability) and using more laser power without expectation of long-term holdover, other servos for thermal stabilization of vapor cell 130 or long-term intensity sampling for the output of local oscillator 120 can be deprioritized by processor(s) 162. This may reduce the total power draw. Thus, atomic clock 100 could be intentionally operated in a low-power mode with reduced performance that may still serve some otherwise non-addressable deployed use cases. Thus, atomic clock 100 may have improved flexibility, performance, cost, size, and manufacturability.

Figure 2:
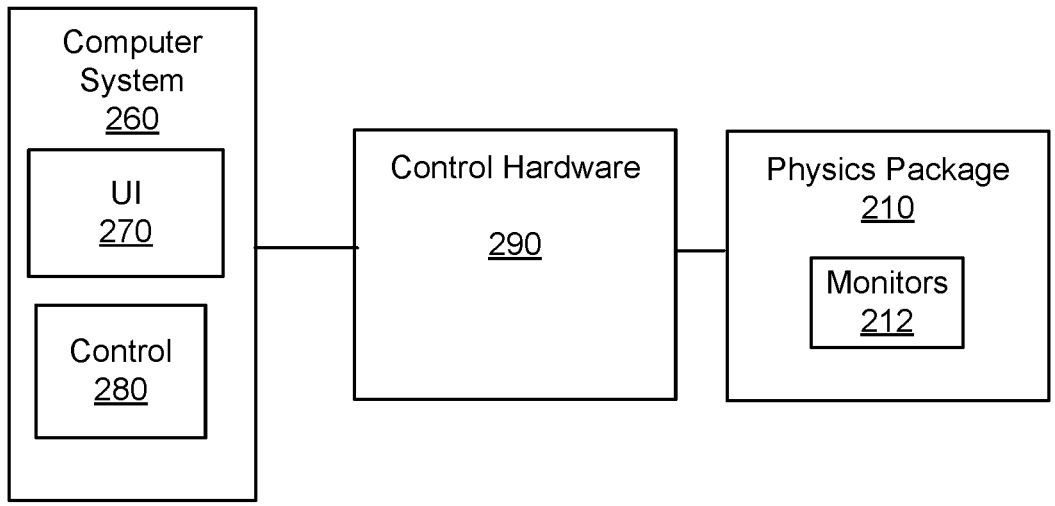
FIG. 2 is a diagram depicting an embodiment of a flexible atomic clock.

FIG. 2 is a diagram depicting an embodiment of a flexible atomic clock 200. Atomic clock 200 includes physics package 210, computer system 260, and control hardware 290. Physics package 210 is analogous to physics package 110. Thus, physics package 210 may include local oscillator(s), a splitter, a frequency comb, a frequency counter, a vapor chamber having atoms therein, a detector, and a local oscillator controller that are analogous to those depicted in FIG. 1. In addition, monitor(s) 212 to interrogate the properties of physics package 210 are expressly included. Such monitors might include temperature sensors, inertial sensors, current sensors, voltage sensors, pressure sensors, spectral sensors (to determine the spectral content of laser light), and/or other sensors. Control hardware 290 may reside in physics package 210 or may be located elsewhere. For example, control hardware 290 may include but is not limited to heaters and coolers for temperature control within a vapor cell or in proximity to other component(s), liquid crystal variable retarders that may be used for polarization control, filters for signal processing control, and/or other components.

Computer system 260 includes user interface 270 and control module 280, which may be implemented using processor(s) analogous to processor(s) 162. User interface 270 allows a user to provide input to atomic clock 200 and for an output to be returned to the user. For example, user interface 270 may include a menu of previously determined modes, such as high accuracy and long-term (holdover) modes. User interface 270 may also allow a user to select or input other operational modes. For example, the desired ADEV for a one second sampling time or the desired holdover may be provided to atomic clock 200 via user interface 270. Control module 280 determines the values of the control parameters and provides these to control hardware 290. Control module 280 may also receive information from control hardware 290 and/or monitors 212. Thus, control module 280 may utilize feedback in determining how to update the control parameters. In some embodiments, monitors 212 may provide information to control hardware 290. Control hardware 290 may be configured to utilize at least some of the information provided by monitors 212 or may pass the information to compute system 260.

Atomic clock 200 operates in an analogous manner to atomic clock 100. Thus, atomic clock 200 may share the benefits of atomic clock 100. Atomic clock 200 may have the ability to use multiple operational modes, the ability to provide customizable operational modes unavailable in conventional atomic clocks, improved flexibility, improved integrability, reduced power and size requirements, and the ability to address issues such as aging, unavailable in conventional atomic clocks. Atomic clock 200 may also allow for improved power management and, therefore, reliability. Consequently, performance may be improved. Atomic clock 200 may also interface with other connected clocks to provide improved performance, either through ensembling, filtering, or providing differential corrections for non common-mode changes. For instance, two clocks may be placed in different thermal environments with different thermal time constants, enabling feed-forward mitigation of thermally-induced frequency excursions that could not be seen with a single clock or its in-chassis sensors. External sensor information can also be ported directly into the clock unit for processing.

Figure 3:
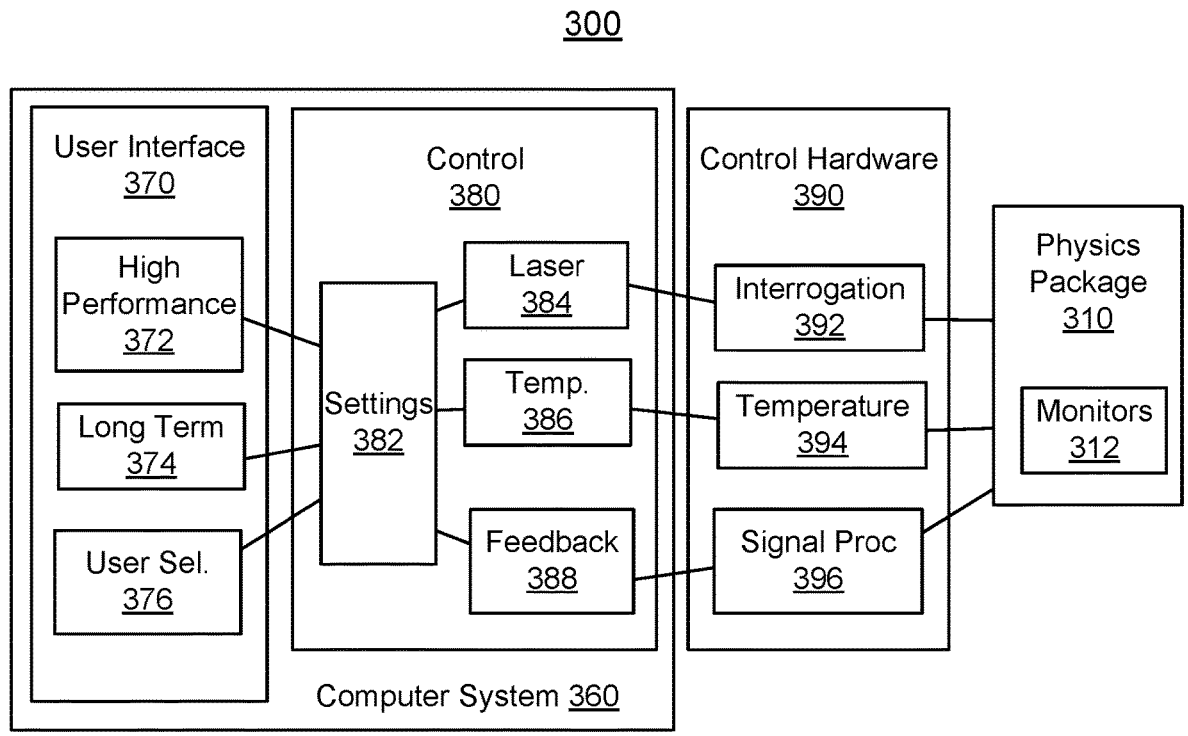
FIG. 3 is a diagram depicting an embodiment of a flexible atomic clock.

FIG. 3 is a diagram depicting an embodiment of a flexible atomic clock 300. Atomic clock 300 includes physics package 310, computer system 360, and control hardware 390 that are analogous to physics package 210, computer system 260, and control hardware 290. Physics package 310 is analogous to physics package(s) 110 and 210. Thus, physics package 310 may include local oscillator(s), a splitter, a frequency comb, a frequency counter, a vapor chamber having atoms therein, a detector, and a local oscillator controller that are analogous to those depicted in FIG. 1. In addition, monitor(s) 312 to interrogate the properties of physics package 310 are expressly included. Such monitors might include temperature sensors, inertial sensors, current sensors, voltage sensors, pressure sensors, spectral sensors (to determine the spectral content of laser light), and/or other sensors.

Although shown separately, control hardware 390 may reside in physics package 310 or elsewhere. Control hardware 390 may include interrogation control components 392, temperature control components 394, and signal control processing components 396. Interrogation control components 390 may include a local oscillator controller analogous to local oscillator controller 150. Other components such as liquid crystal variable retarders may also be included in interrogation control components 390. Liquid crystal variable retarders may be used in the path of the signal (e.g. laser light) from the local oscillator to the atoms in the vapor chamber to optimize the polarization of the signal provided by the local oscillator. For example, a first signal from the local oscillator and having a first linear polarization may be input to the vapor chamber. A second signal from the local oscillator and having a second linear polarization may subsequently be input to the vapor chamber. These polarizations may differ by ninety degrees. Because the walls of the vapor chamber may have a temperature dependent stress-induced birefringence, the different polarizations may result in different characteristics of the fluorescence spectrum of the atoms. Based on these differences, liquid crystal variable retarders may be used to change the polarization of the light provided to the vapor chamber to optimize the interaction with the atoms. Thus, interrogation control components 394 may be linked to the local oscillator of physics package 310 and control laser drive power, an intensity servo actuator to control intensity, liquid crystal variable retarders to control polarization, components used to control the spectrum of the input signal and/or analogous characteristics.

Temperature control components 394 may include heaters and/or coolers as well as drivers for heaters and/or coolers. The heaters and coolers reside in physics package 310 (e.g. in or near a vapor chamber, the local oscillator, and/or other components). Temperature servo update and feedback rates are controlled by the processor.

Signal processing control components 394 may include filters for signal processing control, and/or other components. For example, filters, gain (e.g. for a detector analogous to detector 140), and other aspects of signal processing may be controlled. Signal processing control components 394 may be used in accounting for shocks to and/or vibrations of atomic clock 300. For example, the bandwidth or window of filters may be controlled via signal processing control components 394 to remove characteristic vibrations (e.g. due to motion in a vehicle along a relatively smooth surface) and/or sudden shocks (e.g. due to a sudden change in the surface on which the vehicle is driving). Similarly, signal processing control components can be used to account for characteristic noise in physics package 310. For example, some electrical components may exhibit 150 MHz leakage for 150 MHz modulation frequencies. Filters may be used to account for this noise.

Computer system 360 includes user interface 370 and control module 380, which are analogous to user interface 270 and control module 280. Thus, user interface 370 and control module 380 may be provided using processor(s) analogous to processor(s) 162. In the embodiment shown, user interface 370 includes a menu having three modes: high performance mode 372, long-term (or holdover) mode 374, and a user-set mode 376. High performance mode 372 may provide maser-like stability. Long-term, or holdover mode, may provide accuracy and/or precision analogous to a commercial Cs atomic clock. User-set mode 376 allows the user to set the type of performance desired. For example, the user may provide a holdover decade or an ADEV for a one second time interval. Thus, instead of setting specific control parameters, such as the voltage or current for a particular component, the desired performance of atomic clock 300 is set via user-set mode 376. Modes 372, 374, and 376 provide the selections to control module 380. In some embodiments, other and/or additional modes may be provided. For example, a ruggedization mode (not shown) may be provided in user interface 370. Such a ruggedization mode may correspond to filtering and/or PID values to filter noise due to vibrations and/or shocks that may be incurred during transportation or changes in the clock transition interrogation, such as broader modulation depths.

Control module 380 determines the values of the control parameters and provides these to control hardware 390. Control module 380 includes settings bank 382, laser module 384, temperature module 386, and feedback module 388. Settings bank 382 includes values for control parameters. For example, settings bank 382 may include lookup tables for one or more control parameters. These lookup tables may have base values, ranges for base values, filtering functions for base value calculations, and/or windowing functions which limit the range of values for control parameters. Based on the modes 372, 374, and 376 selected at user interface 370, modules 384, 386, and 388 obtain the values of the corresponding control parameters from settings bank 382. Laser module 384 obtains setpoints for one or more local oscillator control parameters from settings bank 382 and provides the setpoints to interrogation hardware 392.

Similarly, temperature control module 386 may obtain the temperature control setpoints and PID coefficients for temperature control (e.g. heaters and coolers) from settings bank 382 and provides these values to temperature control components 394. Feedback module 388 obtains values for control parameters for clock connections, servo setpoints, allowed overshoot, settling time, filtering parameters, gain setpoints, and analogous control parameters from settings bank 382 and provides these to signal processing components 396.

Control module 380 may also receive information from control hardware 390 and/or monitors 312. Thus, control module 380 may utilize feedback in determining how to update the control parameters. In some embodiments, monitors 312 may provide information to control hardware 390. Monitors 312 may measure characteristics not only of components such as the vapor cell, but also control hardware. Control hardware 390 may be configured to utilize at least some of the information provided by monitors 312 to update component(s) of control module, to pass the information to control modules 380.

Atomic clock 300 operates in an analogous manner to atomic clock 100. A request including an operational mode for the atomic clock is received at user interface 370. The request may include specifying the modes 372, 374, or 376. Values for control parameters are determined by the processor of atomic clock 300 based on the operational mode. For example, values of the control parameters may be retrieved from settings bank 382 and via modules 384, 386, and 388 provided to the appropriate control hardware 392, 394, or 396. Control hardware 392, 394, and 396 set the values for the corresponding components in physics package 310. Thus, atomic clock 200 automatically controls the components of physics package 310 using the values of the parameters. Via monitors 312, the control parameters may be updated to maintain atomic clock 300 in the desired operational mode and/or account for changes in the environment and/or in physics package 310.

Thus, atomic clock 300 may share the benefits of atomic clocks 100 and/or 200. Atomic clock 300 may have the ability to use multiple operational modes, the ability to provide customizable operational modes unavailable in conventional atomic clocks, improved flexibility, improved integrability, reduced power and size requirements, and the ability to address issues such as aging, unavailable in conventional atomic clocks. Atomic clock 300 may also allow for improved power management and, therefore, reliability. Consequently, performance metrics of interest to users may be improved.

Figure 4:
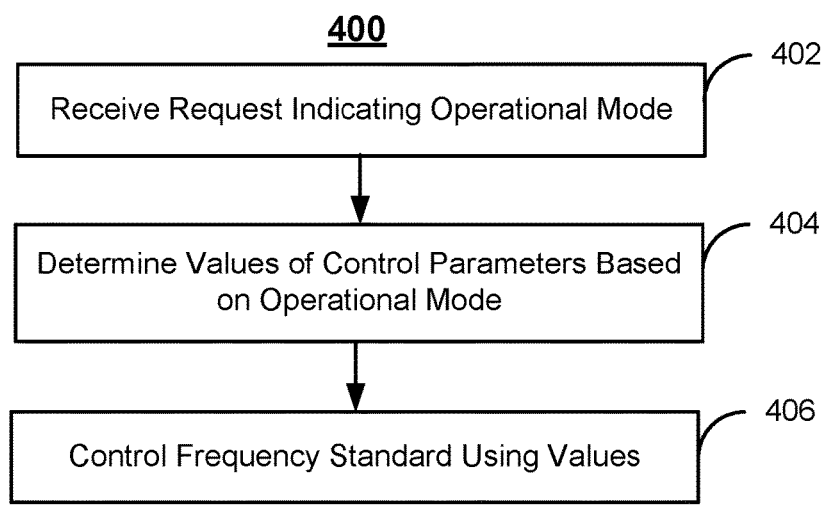
FIG. 4 is a flow chart depicting an embodiment of a method for providing flexible atomic clock.

FIG. 4 is a flow chart depicting an embodiment of method 400 for providing and using flexible atomic clock. Processes of method 400 are described in a particular order. The processes may occur in a different order and/or may include sub-processes.

A request including an operational mode for the atomic clock is received, at 402. The request is received at a computer system. The request identifies a particular mode of operation for the atomic clock from multiple possible operational modes. The atomic clock of method 400 is analogous to atomic clock 100, 200, and/or 300. Thus, the atomic clock includes a local oscillator (e.g. a laser), a vapor cell, a detector, and a frequency controller. Values for control parameters are determined by the processor of the atomic clock based on the operational mode, AT 404. The computer system (e.g. the processor(s)) automatically controls the atomic clock using the values of the parameters. Using method 400, the benefits of atomic clock(s) 100, 200, and/or 300 may be achieved.

Figure 5:
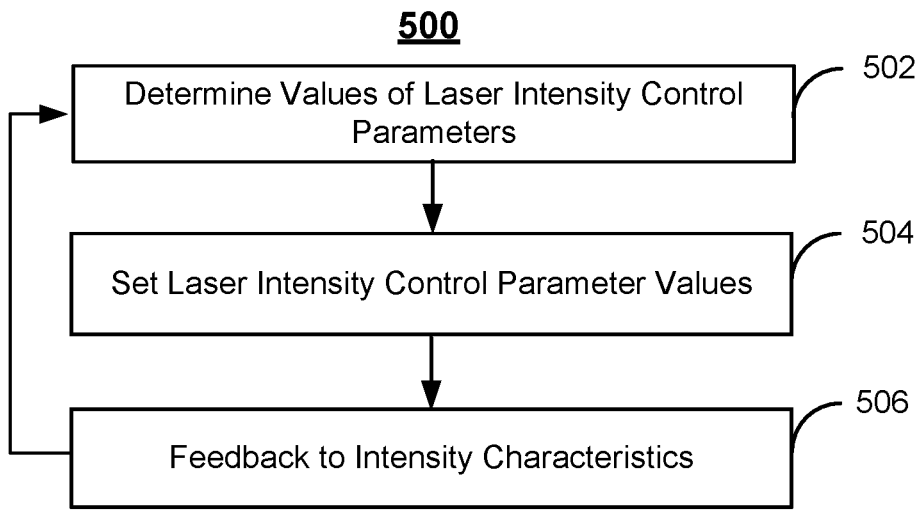
FIG. 5 is a flow chart depicting an embodiment of a method for controlling flexible atomic clock.

FIG. 5 is a flow chart depicting an embodiment of method 500 for controlling flexible atomic clock. Processes of method 500 are described in a particular order. The processes may occur in a different order and/or may include sub-processes. Method 500 may be used in controlling the intensity of the local oscillator.

The values of laser intensity control parameters are determined based on the operational mode, at 502. For example, value(s) for the laser intensity set points, overshoot, rise time, PID coefficients and/or other control parameters are determined for the selected operational mode. 502 may include looking up the values of the control parameters in lookup tables. At 504, the control parameters for the appropriate hardware components are set to the values determined at 502. Thus, the laser intensity may be controlled. At 506, characteristics of the laser intensity may be determined and fed back for continued control. For example, the intensity, atomic fluorescence, and/or other characteristics related to intensity may be monitored at 506. The data may be provided back to the computer system for the values of the laser intensity control parameters to be determined at 502. This process may be continued during operation of the atomic clock. Thus, using method 500, laser intensity may be set and controlled for the desired operational mode.

Figure 6:
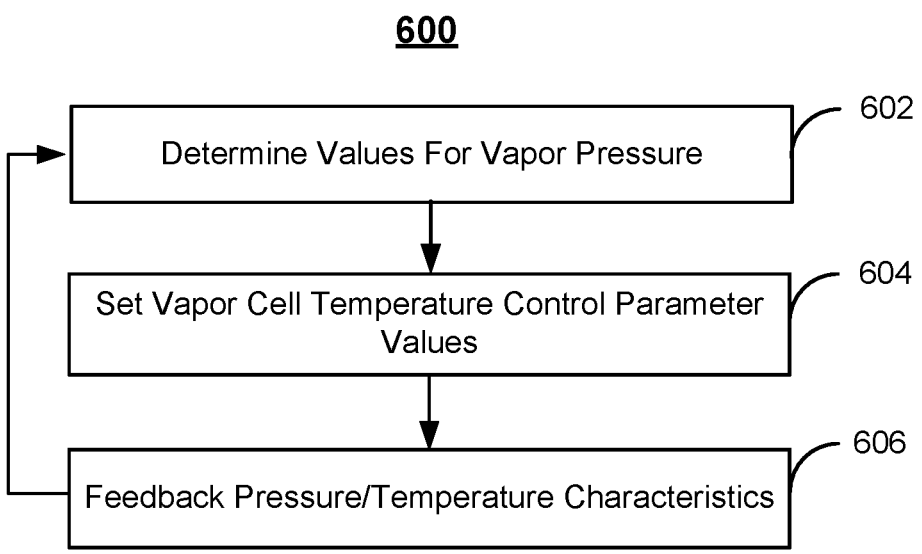
FIG. 6 is a flow chart depicting an embodiment of a method for controlling flexible atomic clock.

FIG. 6 is a flow chart depicting an embodiment of method 600 for controlling flexible atomic clock. Processes of method 600 are described in a particular order. The processes may occur in a different order and/or may include sub-processes. Method 600 may be used in controlling the vapor pressure of atoms in a vapor cell. Method 600 may be used to ensure that operation of the atomic clock is not adversely affected by, for example, loss of the atoms in the vapor cell.

The values of control parameters that may be used in determining the vapor pressure are determined based on the operational mode, at 602. For example, value(s) for the temperature of the vapor cell for the selected operational mode may be determined. 602 may include looking up the values of the control parameters in lookup tables. At 604, the control parameters for heater(s) and/or cooler(s) for the vapor cell are set to the values determined at 602. Thus, the temperature of the vapor cell, and thus the vapor chamber, may be controlled. At 606, the vapor pressure and temperature of the vapor cell may be determined and fed back for continued control. For example, the temperature and/or vapor pressure may be monitored at 606. The data may be provided back to the computer system for the values of the control parameters for the vapor cell to be determined at 602. This process may be continued during operation of the atomic clock. Thus, using method 600, the pressure may be set and controlled for the desired operational mode.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for controlling an atomic clock, comprising:
receiving, at a processor, a request including an operational mode for the atomic clock, a plurality of operational modes for the atomic clock including the operational mode, the atomic clock including a local oscillator, a vapor cell, a detector, and a local oscillator controller, the vapor cell or alternative enclosure including a plurality of atoms and being configured to receive from the local oscillator a signal having a frequency, the signal resulting in transitions of the plurality of atoms between atomic energy states, the detector being configured to detect the transitions and to provide to the local oscillator controller an error signal based on the transitions, the error signal indicating a difference between the frequency and a target frequency, the local oscillator controller being configured to control the local oscillator based on the error signal;
determining, by the processor based on the operational mode, a plurality of values for a plurality of control parameters for the atomic clock, the plurality of control parameters including at least one of local oscillator parameters, vapor cell parameters, detector parameters, and local oscillator controller parameters; and
controlling the atomic clock using the plurality of values.

2. The method of claim 1, further comprising:
monitoring characteristics of at least one of the local oscillator, the vapor cell, and the detector; and
updating, by the processor, the plurality of values of at least a portion of the plurality of control parameters based on the characteristics.

3. The method of claim 1, wherein the determining further includes:
restricting, by the processor, a value of the plurality of values to within an operational window for a corresponding control parameter of the plurality of control parameters.

4. The method of claim 1, wherein the plurality of operational modes include a high precision mode and a long-term mode.

5. The method of claim 4, wherein the high precision mode has a short-term fractional frequency instability of less than $10^{-13}$ for an averaging time of less than one second; and
wherein the long-term mode has a long-term fractional frequency instability of less than $10^{-13}$ and a frequency drift of not more than one part in $10^{12}$ for long-term operation times of at least one day and not more than two weeks.

6. The method of claim 4, wherein the plurality of operational modes further includes:
a user-defined operational mode.

7. The method of claim 1, wherein the local oscillator is a laser and wherein the plurality of control parameters include at least one of a vapor cell temperature set point, a vapor pressure set point for the vapor cell, an atomic clock temperature set point, a laser intensity set point for the laser, a detector filtering bandwidth, a polarization of the signal from the laser, a detector gain, and proportional integral differential (PID) coefficients for at least one servo, the at least one servo for at least one of the laser, the vapor cell, the detector, and the local oscillator controller.

8. An atomic clock, comprising:
a local oscillator;
a vapor cell including a plurality of atoms and being configured to receive from the local oscillator a signal having a frequency, the signal resulting in transitions of the plurality of atoms between atomic energy states;
a detector, the detector being configured to detect the transitions;
a local oscillator controller coupled to the detector and the local oscillator, the detector being configured to provide to the local oscillator controller an error signal based on the transitions, the error signal indicating a difference between the frequency and a target frequency, the local oscillator controller being configured to control the local oscillator based on the error signal; and a processor configured to:
receive a request including an operational mode for the atomic clock, a plurality of operational modes for the atomic clock including the operational mode;
determine, based on the operational mode, a plurality of values for a plurality of control parameters for the atomic clock, the plurality of control parameters including at least one of local oscillator parameters, vapor cell parameters, detector parameters, and local oscillator controller parameters; and
control the atomic clock using the plurality of values.

9. The atomic clock of claim 8, further comprising:
a plurality of monitors configured to measure characteristics of at least one of the local oscillator, the vapor cell, and the detector; and wherein the processor is further configured to
update the plurality of values of at least a portion of the plurality of control parameters based on the characteristics.

10. The atomic clock of claim 8, wherein the processor being configured to determine further includes the processor being configured to:
restrict a value of the plurality of values to within an operational window for a corresponding control parameter of the plurality of control parameters.

11. The atomic clock of claim 8, wherein the plurality of operational modes includes a high precision/short-term mode and a long-term/lower accuracy mode.

12. The atomic clock of claim 11, wherein the high precision/short-term mode has a short-term fractional frequency instability of less than $10^{-13}$ for operation times of at least one second less than one week; and
the long-term/lower accuracy mode has a long-term fractional frequency instability of less than $10^{-13}$ and a frequency drift of not more than ten parts in $10^{12}$ for long-term operation times of at least one day and not more than two weeks.

13. The atomic clock of claim 11, wherein the plurality of operational modes further includes:
a user-defined operational mode.

14. The atomic clock of claim 8, wherein the local oscillator is a laser and wherein the plurality of control parameters include at least one of a vapor cell temperature set point, a vapor pressure set point for the vapor cell, an atomic clock temperature set point, a laser intensity set point for the laser, a detector filtering bandwidth, a polarization of the signal from the laser, a detector gain, and proportional integral differential (PID) coefficients for at least one servo, the at least one servo for at least one of the laser, the vapor cell, the detector, and the local oscillator controller.

15. A computer program product embodied in a non-transitory computer readable medium and comprising computer instructions for:
receiving a request including an operational mode for an atomic clock, a plurality of operational modes for the atomic clock including the operational mode, the atomic clock including a local oscillator, a vapor cell, a detector, and a local oscillator controller, the vapor cell including a plurality of atoms and being configured to receive from the local oscillator a signal having a frequency, the signal resulting in transitions of the plurality of atoms between atomic energy states, the detector being configured to detect the transitions and to provide to the local oscillator controller an error signal based on the transitions, the error signal indicating a difference between the frequency and a target frequency, the local oscillator controller being configured to control the local oscillator based on the error signal;
determining based on the operational mode, a plurality of values for a plurality of control parameters for the atomic clock, the plurality of control parameters including at least one of local oscillator parameters, vapor cell parameters, detector parameters, and local oscillator controller parameters; and
controlling the atomic clock using the plurality of values.

16. The computer program product of claim 15, wherein the computer instructions further include computer instructions for:
monitoring characteristics of at least one of the local oscillator, the vapor cell, and the detector; and
updating the plurality of values of at least a portion of the plurality of control parameters based on the characteristics.

17. The computer program product of claim 15, wherein the computer instructions for determining further include computer instructions for:
restricting a value of the plurality of values to within an operational window for a corresponding control parameter of the plurality of control parameters.

18. The computer program product of claim 15, wherein the plurality of operational modes includes a high accuracy mode and a long-term mode.

19. The computer program product of claim 18, wherein the high accuracy mode has a short-term fractional frequency instability of less than $10^{-13}$ for operation times of less than one week; and
wherein the long-term mode has a long-term fractional frequency instability of less than $10^{-13}$ and a frequency drift of not more than ten parts in $10^{12}$ for long-term operation times of at least one day and not more than two weeks.

20. The computer program product of claim 15, wherein the local oscillator is a laser and wherein the plurality of control parameters include at least one of a vapor cell temperature set point, a vapor pressure set point for the vapor cell, an atomic clock temperature set point, a laser intensity set point for the laser, a detector filtering bandwidth, a polarization of the signal from the laser, a detector gain, and proportional integral differential (PID) coefficients for at least one servo, the at least one servo for at least one of the laser, the vapor cell, the detector, and the local oscillator controller.

* * * * *